US012581696B2

(12) United States Patent
Nikonov et al.

(10) Patent No.: US 12,581,696 B2
(45) Date of Patent: Mar. 17, 2026

(54) TECHNOLOGIES FOR TRANSISTORS WITH A FERROELECTRIC GATE DIELECTRIC

(71) Applicants: Dmitri Evgenievich Nikonov, Beaverton, OR (US); Chia-Ching Lin, Portland, OR (US); Uygar E. Avci, Portland, OR (US); Tanay A. Gosavi, Portland, OR (US); Raseong Kim, Portland, OR (US); Ian Alexander Young, Olympia, WA (US); Hai Li, Portland, OR (US); Ashish Verma Penumatcha, Beaverton, OR (US); Ramamoorthy Ramesh, Moraga, CA (US); Darrell G. Schlom, Ithaca, NY (US)

(72) Inventors: Dmitri Evgenievich Nikonov, Beaverton, OR (US); Chia-Ching Lin, Portland, OR (US); Uygar E. Avci, Portland, OR (US); Tanay A. Gosavi, Portland, OR (US); Raseong Kim, Portland, OR (US); Ian Alexander Young, Olympia, WA (US); Hai Li, Portland, OR (US); Ashish Verma Penumatcha, Beaverton, OR (US); Ramamoorthy Ramesh, Moraga, CA (US); Darrell G. Schlom, Ithaca, NY (US)

( * ) Notice: Subject to any disclaimer, the term of this patent is extended or adjusted under 35 U.S.C. 154(b) by 805 days.

(21) Appl. No.: 17/734,372

(22) Filed: May 2, 2022

(65) Prior Publication Data
US 2023/0352584 A1    Nov. 2, 2023

(51) Int. Cl.
H10D 30/69 (2025.01)
H10B 51/30 (2023.01)
(Continued)

(52) U.S. Cl.
CPC ........... H10D 30/701 (2025.01); H10B 51/30 (2023.02); H10D 30/0415 (2025.01);
(Continued)

(58) Field of Classification Search
CPC .. H10D 64/689; H10D 64/691; H10D 64/033; H10D 30/701; H10D 30/0415;
(Continued)

(56) References Cited

U.S. PATENT DOCUMENTS 5,767,543 A     6/1998  Ooms et al.
5,830,270 A *  11/1998  McKee ................... C30B 25/02
117/106
(Continued)

FOREIGN PATENT DOCUMENTS

JP         2004179617 A     6/2004

OTHER PUBLICATIONS

Cheng, et al., "Nanoscale etching of perovskite oxides for field effect transistor applications," Journal of Vacuum Science, American Institute of Physics; Melville, NY; vol. 38, No. 1; Dec. 18, 2019; 7 pages.
(Continued)

*Primary Examiner* — Jose R Diaz
(74) *Attorney, Agent, or Firm* — Alliance IP, LLC

(57) ABSTRACT

Technologies for a transistor with a ferroelectric gate dielectric are disclosed. In the illustrative embodiment, a transistor has a ferroelectric gate dielectric that is lattice matched to the channel of the transistor. In one embodiment, the ferroelectric polarization changes when voltage is applied and removed from a gate electrode, facilitating switching of the transistor at a lower applied voltage. In another embodiment, the ferroelectric polarization of a gate dielectric of a transistor changes when the voltage is past a positive threshold
(Continued)

100 value or a negative threshold value. Such a transistor can be used as a one transistor memory cell.

20 Claims, 9 Drawing Sheets

(51) Int. Cl.

| | |
|---|---|
| *H10D 30/01* | (2025.01) |
| *H10D 30/60* | (2025.01) |
| *H10D 62/40* | (2025.01) |
| *H10D 62/80* | (2025.01) |
| *H10D 64/01* | (2025.01) |
| *H10D 64/68* | (2025.01) |

(52) U.S. Cl.
CPC ............. *H10D 30/60* (2025.01); *H10D 62/40* (2025.01); *H10D 62/80* (2025.01); *H10D 62/874* (2025.01); *H10D 64/033* (2025.01); *H10D 64/689* (2025.01)

(58) Field of Classification Search
CPC ................. H10D 30/60; H10D 62/874; H01L 21/02197; H10B 51/00–53/50
See application file for complete search history.

(56) References Cited

U.S. PATENT DOCUMENTS

| | | | |
|---|---|---|---|
| 6,262,462 | B1 | 7/2001 | Marshall et al. |
| 9,853,150 | B1 | 12/2017 | Colinge et al. |
| 2010/0001324 | A1 | 1/2010 | Furukawa et al. |
| 2017/0352539 | A1* | 12/2017 | Yang ................. H01L 21/02395 |
| 2018/0374933 | A1 | 12/2018 | Cheng et al. |
| 2019/0245130 | A1 | 8/2019 | Jha et al. |
| 2020/0357911 | A1 | 11/2020 | Frougier et al. |
| 2021/0151445 | A1 | 5/2021 | Wagner et al. |
| 2021/0257452 | A1 | 8/2021 | Trivedi et al. |

OTHER PUBLICATIONS

EPO European Extended Search Report in EP Application Serial No. 23166327.9 mailed on Sep. 25, 2023, 12 pages.

J. Cheng et al., "High-Current Perovskite Oxide BaTiO3/BaSnO3 Heterostructure Field Effect Transistors," in IEEE Electron Device Letters, vol. 41, No. 4, pp. 621-624, Apr. 2020, doi: 10.1109/LED.2020.2976456.

Mathews, S., et al., "Ferroelectric Field Effect Transistor Based on Epitaxial Perovskite Heterostructures," Science, [Online] vol. 276, No. 5310; Apr. 11, 1997, pp. 238-240; 4 pages.

U.S. Appl. No. 18/091,676, filed Dec. 30, 2022.

U.S. Appl. No. 18/091,714, filed Dec. 30, 2022.

Dawber, M., et al., "Physics of thin-film ferroelectric oxides," Reviews of Modern Physics, vol. 77, No. 4; Oct. 2005, pp. 1083-1130; 48 pages.

Dingle, R., et al., "Electron mobilities in modulation-doped semiconductor heterojunction superlattices," Appl. Phys. Lett. 33(7), Oct. 1, 1978; pp. 665-667; 3 pages.

Eom, Kitae, et al., "Oxide Two-Dimensional Electron Gas with High Mobility at Room-Temperature," Advanced Science, 2022, vol. 2105652; 8 pages.

Hong, Xia, "Emerging ferroelectric transistors with nanoscale channel materials: the possibilities, the limitations," Journal of Physics: Condensed Matter; 2016; IP Publishing Ltd, United Kingdom; 33 pages.

Hwang, Y. H., et al., "Emergent phenomena at oxide interfaces," Nature Materials; vol. 11; Feb. 2012; pp. 103-113; 11 pages.

M. Holtz, et al., "A Room-Temperature Magnetoelectric Multiferroic made by Thin Film Alchemy," as presented at AVS 66th International Symposium and Exhibition, Oct. 21, 2019 (34 pgs).

Manipatruni, Sasikanth, et al., "Scalable energy-efficient magnetoelectric spin-orbit logic," Springer Nature Limited, 2018; 9 pages.

Nakagawa, Naoyuki, et al., "Why some interfaces cannot be sharp," nature materials vol. 5 Mar. 2006; pp. 204-209; 6 pages.

Prakash, Abhinav, et al., "Separating Electrons and Donors in BaSnO3 via Band Engineering," Nano Letters, 2019; pp. 8920-8927; 8 pages.

R. Steinhardt, et al., "Breaking Symmetries to Create a Robust Room-Temperature Ferrimagnetic Ferroelectric in LuFeO3/CoFe2O4 Superlattices," as presented at Materials Research Society Symposium EL03—Multiferroics and Magnetoelectrics, Dec. 3, 2019 (40 pgs).

Ramesh, R., "Complex functional oxide heterostructures," Current Science, vol. 105, No. 8, Oct. 25, 2013, pp. 1107-1144; 8 pages.

S. Dünkel et al., "A FeFET based super-low-power ultra-fast embedded NVM technology for 22nm FDSOI and beyond," 2017 IEEE International Electron Devices Meeting (IEDM), 2017, pp. 19.7.1-19.7.4, doi: 10.1109/IEDM.2017.8268425; 4 pages.

Tokura, Yoshinori, "Correlated-Electron Physics in Transition-Metal Oxides," Physics Today, Jul. 2003; pp. 50-55; 6 pages.

Yu, P., "Emergent phenomena at multiferroic heterointerfaces," Philosophical Transactions of The Royal Society, 2012; pp. 4856-4871; 16 pages.

Grünebohm, Anna, et al., "Tuning the caloric response of BaTiO3 by tensile epitaxial strain," Europhysics Letters, vol. 115, No. 4; 6 pages.

Lee, Daesu, et al., "Giat flexoelectric effect through interfacial strain relaxation," Philosophical Transactions of The Royal Society A; 2012; pp. 4944-4957; doi:10.1098/rsta.2012.0200; 14 pages.

Schlom, Darrell G., et al., "Elastic strain engineering of ferroic oxides," MRS Bulletin; vol. 39, pp. 118-130; Feb. 2014; 13 pages.

U.S. Appl. No. 17/956,296, filed Sep. 29, 2022.

U.S. Appl. No. 17/958,094, filed Sep. 30, 2022.

U.S. Appl. No. 17/958,362, filed Oct. 1, 2022.

U.S. Appl. No. 17/557,119, filed Dec. 21, 2021.

EPO Communication Pursuant to Article 94(3) EPC in EP Application Serial No. 23166327.9 mailed on Jul. 14, 2025, 6 pages.

Jurczak M. et al: "Review of FINFET technology", SOI Conference, 2009 IEEE International, Oct. 1, 2009 (Oct. 1, 2009), pp. 1-4, XP093294223, Piscataway, NJ, USA DOI: 10.1109/SOI.2009.5318794; 4 pages.

* cited by examiner

300

400

800

802

802

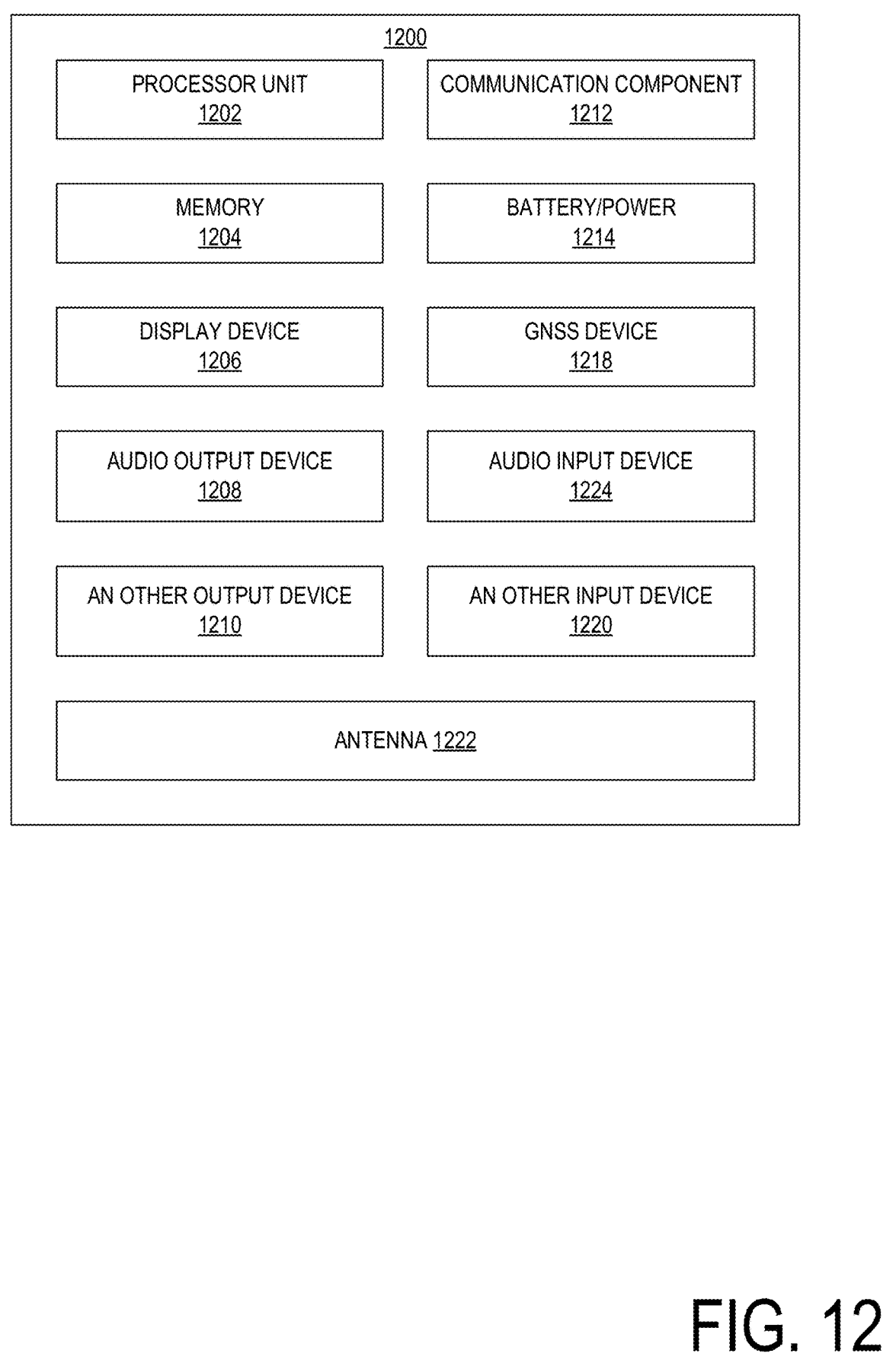

1200

| PROCESSOR UNIT 1202 | COMMUNICATION COMPONENT 1212 |
|---|---|
| MEMORY 1204 | BATTERY/POWER 1214 |
| DISPLAY DEVICE 1206 | GNSS DEVICE 1218 |
| AUDIO OUTPUT DEVICE 1208 | AUDIO INPUT DEVICE 1224 |
| AN OTHER OUTPUT DEVICE 1210 | AN OTHER INPUT DEVICE 1220 |

ANTENNA 1222

FIG. 12

TECHNOLOGIES FOR TRANSISTORS WITH A FERROELECTRIC GATE DIELECTRIC

GOVERNMENT RIGHTS

This invention was made with government support under Grant No. FA9550-20-1-0102 awarded by the Air Force Office of Scientific Research. The government has certain rights in the invention.

BACKGROUND

Transistors are ubiquitous devices present in virtually all electronic devices. As the density of transistors continues to increase, the power dissipated by the transistors needs to be addressed. The power dissipated can be removed by heat sinks or cold plates. The power dissipation of a transistor can be reduced in several ways, such as reducing leakage current and reducing the threshold voltage of the transistor.

A typical transistor can maintain its state when a voltage is maintained at a gate electrode. However, a ferroelectric field-effect transistor (FEFET) can maintain its state based on a state of a ferroelectric layer in the transistor. FEFETs typically have a relatively high threshold voltage and a corresponding relatively high leakage current.

BRIEF DESCRIPTION OF THE DRAWINGS

FIG. 12 is a block diagram of an example electrical device that may include a microelectronic assembly, in accordance with any of the embodiments disclosed herein.

DETAILED DESCRIPTION

Figure 1:
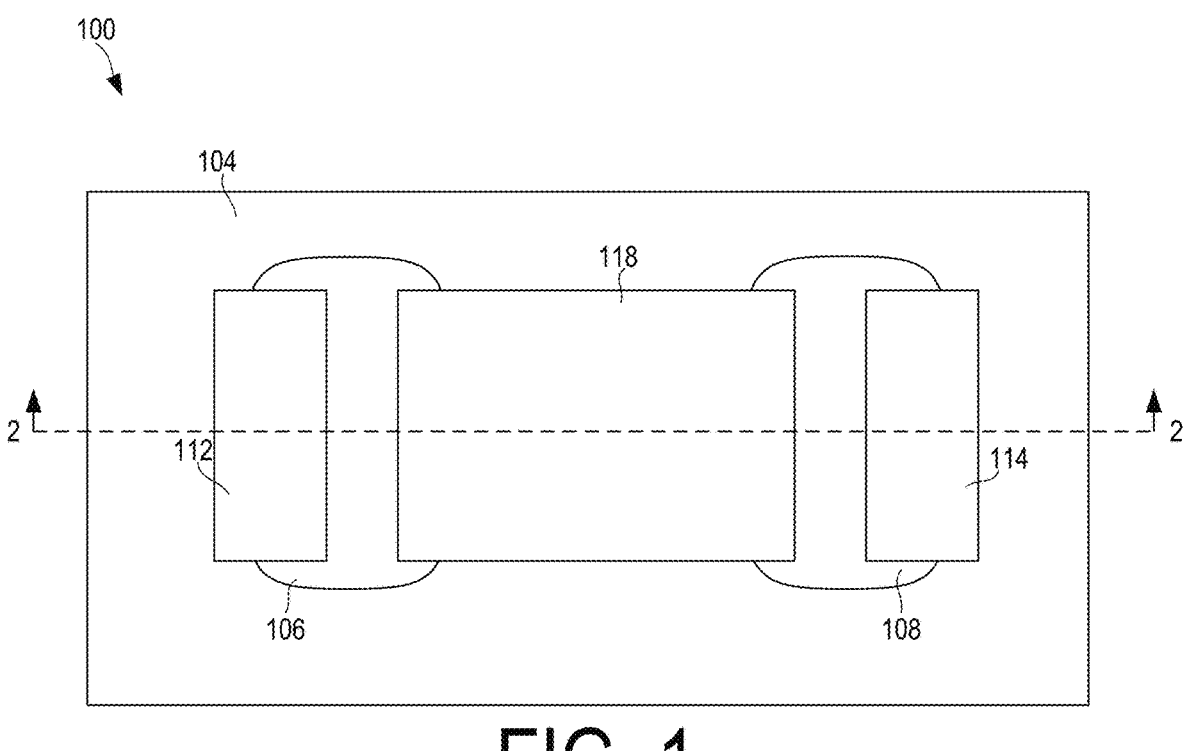
FIG. 1 is a top view of a transistor with a gate dielectric that is ferroelectric.

Ferroelectric field-effect transistors (FEFETs) can use the spontaneous polarization in a ferroelectric material to apply an electric displacement to raise or lower a gate voltage above or below a threshold voltage. The orientation of the spontaneous polarization in the ferroelectric material can be changed by the application of an electric field to a gate of the transistor, allowing the transistor to be used as a memory cell. In some cases, a FEFET has a ferroelectric hafnium zirconium oxide ($Hf_xZr_{1-x}O_2$) over a silicon channel. The coercive voltage to change the electric field of the ferroelectric material is typically 3-5 volts.

In one embodiment disclosed herein, as described in more detail blow, the gate dielectric of a transistor is a ferroelectric perovskite, such as lead zirconate titanate (or PZT). As used herein, a dielectric material includes a linear dielectric material, a paraelectric material, or a ferroelectric material. The material of the channel is also a perovskite, with a lattice constant that matches that of the gate dielectric. The similarity of the gate dielectric and channel materials can reduce lattice defects, reduce trapped charges, reduce oxygen vacancies, and/or reduce polycrystalline or amorphous structure. As a result, the transistor performance can be increased, and the threshold voltage and leakage current can be reduced.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate, and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Figure 2:
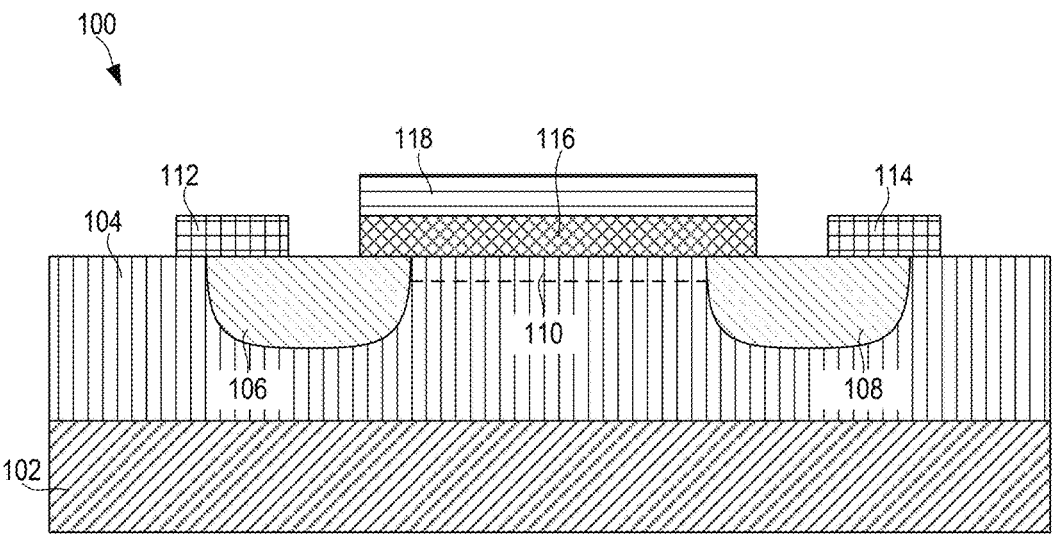
FIG. 2 is a cross-sectional side view of the transistor of FIG. 1.

Referring now to FIGS. 1 and 2, in one embodiment, a transistor 100 has a substrate 102, a body 104, a source 106, and a drain 108. FIG. 1 shows a top-down view of the transistor 100, and FIG. 2 shows a cross-sectional view of the transistor 100. A channel 110 is between the source 106 and the drain 108. A source electrode 112 is in contact with the source 106, and a drain electrode 114 is in contact with the drain 108. A gate dielectric 116 is above the channel 110, and a gate electrode 118 is above the gate dielectric 116.

In use, a voltage can be applied to the gate electrode 118, which causes an electric field to be applied to the gate dielectric 116 and to the channel 110. The illustrative gate dielectric 116 is ferroelectric. In the illustrative embodiment, if the applied voltage causes an electric field above a coercive field, the direction of the spontaneous polarization of the ferroelectric material can switch. The electric displacement of the ferroelectric material is the spontaneous polarization of the ferroelectric when no electric field is applied by the gate electrode 118. Under the applied field from the voltage of the gate electrode 118, the electric displacement of the ferroelectric material increases. As a result, the electric displacement applied to the channel 110 is affected by the polarization state of the ferroelectric material of the gate dielectric 116, and, therefore, the current through the channel 110 is affected by the polarization state of the ferroelectric material of the gate dielectric 116. As discussed in more detail below, this property can be used to facilitate low-threshold switching, single transistor memory, and compute-in-memory.

In the illustrative embodiment described in detail below, the transistor 100 is a planar transistor. More generally, the transistor 100 may be implemented as, e.g., FinFET, gate-all-around, and stacked gate-all-around transistors, as described in more detail below in regard to FIGS. 10A-10D.

The substrate 102 supports the body 104 and the rest of the transistor 100. In the illustrative embodiment, the substrate 102 is strontium titanium oxide ($SrTiO_3$ or STO or strontium titanate). The strontium titanium oxide, in turn, may be supported by, e.g., silicon, silicon dioxide, or any other suitable material. In other embodiments, the substrate 102 may be any suitable material that can interface with the body 104, such as $WO_3$, $NaTaO_3$, $BaTiO_3$, $KTaO_3$, $LaAlO_3$, $MgO$, or $Al_2O_3$.

In the illustrative embodiment, the body 104 is a perovskite material. A perovskite material is any crystalline material with a crystal structure similar to calcium titanate ($CaTiO_3$), typically with the chemical formula of $ABX_3$, where A is one element, B is a second element, and X is a third element. In some cases, some of one (or more) of element A, B, or X in a perovskite material may be replaced by a different element. For example, in one embodiment, $Pb(Zr_xTi_{1-x})O_3$ (i.e., lead zirconate titanate or PZT) can have both zirconium and titanium as element B, with a varying amount of each depending on the value of x. A perovskite material may have various cation pairings, such as $A^+B^{2+}X^-_3$, $A^{2+}B^{4+}X^{2-}_3$, $A^{3+}B^{3+}X^{2-}_3$, or $A^+B^{5+}X^{2-}_3$. The body 104 may be any suitable perovskite material, such as barium tin oxide ($BaSnO_3$, or barium stannate) La-doped STO, $Pb(Zr_{0.52}Ti_{0.48})O_3$, $CaMnO_3$, and/or the like. In some embodiments, the body 104 may not be a perovskite. For example, the body 104 may be indium oxide, indium tin oxide (ITO), indium zinc oxide (IZO), indium tungsten oxide (IWO), indium gallium zinc oxide (IGZO), or any other suitable material, such as other materials that do not have interface oxide layers. Some or all of the body 104 may be n-doped or p-doped, depending on the transistor type.

In the illustrative embodiment, the channel 110 is the same material as the body 104. In some embodiments, the channel 110 may be any of the materials referenced above in regard to the body 104. In some embodiments, the channel 110 may be doped differently from the rest of the body 104. The channel 110 has a relatively high electron mobility, such as at least 50-500 $cm^2/(V*s)$. In the illustrative embodiment, the channel 110 is barium tin oxide with an electron mobility of about 100 $cm^2/(V*s)$.

In the illustrative embodiment, the channel 110 is lattice matched to the gate dielectric 116. As used herein, a material in the channel 110 is lattice matched to the material in the gate dielectric 116 if the lattice constant for the channel 110 is within 1% of the lattice constant of the gate dielectric 116. In other embodiments, the lattice mismatch between channel 110 and the gate dielectric 116 may be lower, such as less than 0.1% or less than 0.01% of the lattice constant of the gate dielectric 116.

Each of the source 106 and drain 108 may be any suitable material, such as any of the materials referenced above in regard to the body 104 or channel 110. In the illustrative embodiment, each of the source 106 and drain 108 are the same material as the body 104 but with a different doping to make it more conductive. For example, for an n-doped channel 110, the source 106 and drain 108 may be n-doped, and for a p-doped channel 110, the source 106 and drain 108 may be p-doped. In the illustrative embodiment, the transistor 100 is symmetric, and there is no functional distinction between the source 106 and the drain 108.

The source electrode 112 and drain electrode 114 may be any suitable material. For example, the source electrode 112 and/or the drain electrode 114 may be platinum, iridium, or other metal, polysilicon, a metallic perovskite, etc.

The illustrative gate dielectric 116 is lead zirconate titanate. The relative concentration or zirconium and titanium may be selected so that the gate dielectric 116 is lattice matched to the channel 110. In other embodiments, the gate dielectric 116 may be any suitable perovskite or nonperovskite ferroelectric. For example, the gate dielectric 116 may be barium titanate ($BaTiO_3$ or BTO), lead niobate zirconate titanate ($(Pb_{1-x}Nb_x)(Zr_{1-y}Ti_y)O_3$ or PNZT), lead lanthanum zirconate titanate ($(Pb_{1-x}La_x)(Zr_{1-y}Ti_y)O_3$ or PLZT), bismuth ferrite ($BiFeO_3$ or BFO), lanthanum bismuth ferrite ($LaxBi_{1-x}FeO_3$ or LaBFO), etc. In the illustrative embodiment, the gate dielectric 116 has a relatively low coercive field of about 130 kV/cm, allowing the direction of the spontaneous polarization of the ferroelectric material of the gate dielectric 116 to be changed with a relatively low voltage applied to the gate electrode 118. More generally, the gate dielectric 116 may have any suitable coercive field, such as 50-500 kV/cm. The gate dielectric 116 may be any suitable thickness. In the illustrative embodiment, the gate dielectric 116 may have a thickness of about 20-230 nanometers. Properties of the gate dielectric 116, such as the coercive field, may depend on the crystal orientation. Any suitable crystal orientation may be used, which may depend on the particular material being used. For example, ferroelectric gate dielectric 116 of PZT may have a crystal orientation of, e.g., (111) or (001) pseudocubic indices.

The threshold voltage of the transistor 100 depends on the gate dielectric 116 material as well as the channel 110 thickness and doping concentration. In the illustrative embodiment, the threshold voltage of the transistor 100 is about 250 millivolts applied to the gate electrode 118, with the polarization of the ferroelectric material of the gate dielectric 116 increasing the electric displacement applied to the channel 110. In other embodiments, the threshold voltage of the transistor 100 may be any suitable value, such as 0.2-5 volts, depending on the materials used.

In some embodiments, the polarization of the ferroelectric of the gate dielectric 116 switches all at once in a few picoseconds. In other embodiments, the ferroelectric of the gate dielectric 116 may have multiple domains that may switch at different applied electric fields (and, therefore, at different times). In such embodiments, the ferroelectric of the gate dielectric 116 may have multiple stable states that can be set by applying a particular voltage to the gate electrode 118. Such a transistor 100 can act as a multi-level memory or like an analog memory.

Figure 3:
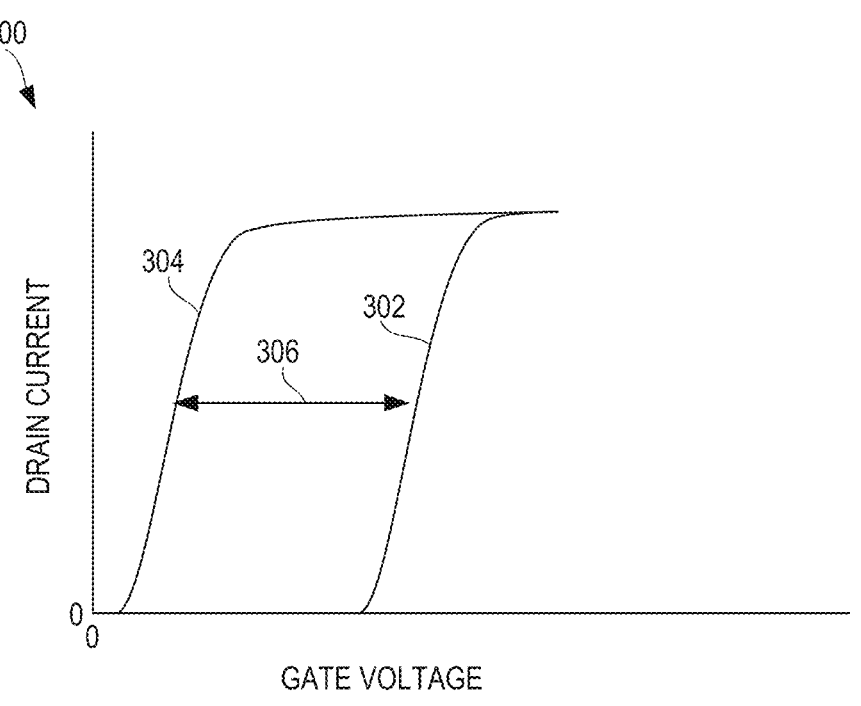
FIG. 3 is a graph showing a voltage-current relationship for one embodiment of the transistor of FIG. 1.

The illustrative gate electrode 118 is a metallic perovskite, such as strontium ruthenate ($SrRuO_3$ or SRO), lanthanum strontium manganite ($La_{1-x}Sr_xMnO_3$ or LMSO), lanthanum strontium cobalt oxide ($La_{1-x}Sr_xCoO_3$ or LSCO), $SrVO_3$, $SrCrO_3$, $SrFeO_3$, $ReO_3$, $CaRuO_3$, $SrMoO_3$, $SrNbO_3$, $LaNiO_3$, etc. In other embodiments, the gate electrode 118 may be other materials, such as platinum, iridium, or other metal, oxides with high electric conductivity that do not have the perovskite structure including $RuO_2$, $IrO_2$, and ITO, polysilicon, etc. In the illustrative embodiment, the work function of the gate electrode 118 is selected to shift the coercive voltage across the gate dielectric 116. For example, in one embodiment, FIG. 3 shows a curve of current from the source 106 to the drain 108, for a given voltage across the source 106 and drain 108, as voltage applied to the gate electrode 118 is increased and then decreased. As the gate voltage is increased, the current follows the curve 302, and as the gate voltage is decreased, the current follows the curve 304. As the gate voltage is applied, the voltage increases past a first ferroelectric switching voltage to switch the spontaneous polarization of the gate dielectric 116 to a positive polarization (i.e., a polarization that applies an electric displacement in the direction of that caused by the gate dielectric 116). When the spontaneous polarization of the gate dielectric 116 switches, the electric displacement applied to the channel 110 increases as well, effectively turning on the transistor 100 at the same time as the spontaneous polarization of the gate dielectric 116 is switched. As the gate voltage is decreased, the voltage decreases past a second ferroelectric switching voltage to switch the spontaneous polarization of the gate dielectric 116 to a negative polarization (i.e., a polarization that applies an electric displacement opposite the direction of that caused by the gate dielectric 116). The difference 306 between the two ferroelectric switching voltages corresponds to $2*E_C*d_{FE}$, where $E_C$ is the coercive field of the gate dielectric 116 and di is the thickness of the gate dielectric 116.

It should be appreciated that the position of the ferroelectric switching voltages depends on the gate electrode 118. In FIG. 3, the lower ferroelectric switching voltage is shifted to a positive voltage, allowing the polarization of the ferroelectric to be controlled without applying a negative voltage to the gate electrode 118.

Figure 4:
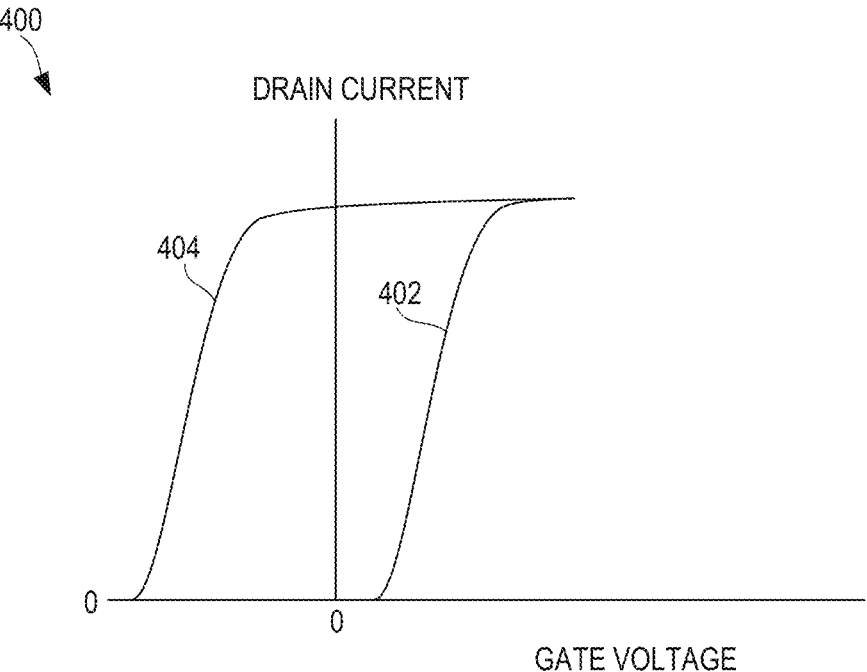
FIG. 4 is a graph showing a voltage-current relationship for one embodiment of the transistor of FIG. 1.

In another embodiment, a transistor 100 may use a gate electrode 118, gate dielectric 116, channel 110, etc., that results in a gate voltage/drain current relationship as shown in FIG. 4. Following the curve 402, as a positive voltage is applied to the gate electrode 118, the spontaneous polarization of the ferroelectric material of the gate dielectric 116 is flipped. Following the curve 402, in one embodiment, as the voltage is reduced back to zero, the direction of the spontaneous polarization of the ferroelectric material of the gate dielectric 116 remains the same, effectively allowing the ferroelectric material of the gate dielectric 116 to turn the transistor 100 on with no external voltage applied. In other embodiments, the polarization of the ferroelectric material of the gate dielectric 116 may be less than the threshold voltage of the transistor 100. In order to flip the ferroelectric material back to the first polarization, the voltage applied to the gate electrode 118 must go to a negative value.

In the illustrative embodiment, the transistor 100 has a gate voltage/drain current curve as shown in FIG. 3, with a threshold voltage of 250 millivolts. The low threshold voltage reduces leakage current and reduces overall energy dissipation in the transistor. Such a transistor 100 can be used for general computing tasks such as adders, memory cells, etc.

In another embodiment, the transistor 100 has a gate voltage/drain current curve, as shown in FIG. 4. Such a transistor 100 can be used as a one-transistor memory cell to store one bit. The transistor 100 can be set by increasing the voltage past a threshold to set the polarization of the ferroelectric material of the gate dielectric 116 one way, and the transistor 100 can be cleared by decreasing the voltage past a threshold to set the polarization of the ferroelectric material of the gate dielectric 116 the opposite way. The ferroelectric material of the gate dielectric 116 will maintain its polarization without a voltage applied to the gate electrode 118, allowing the transistor 100 to act as a non-volatile memory cell. The state of the ferroelectric material of the gate dielectric 116 can be probed by detecting the current that can pass between the source 106 and the drain 108 at a given voltage.

In yet another embodiment, the transistor 100 can be used in a compute-in-memory system. In such an embodiment, the transistor 100 can be used both to perform calculations and store data. For example, in one embodiment, a transistor 100 may be used to implement a machine-learning-based algorithm, such as a neural network. A transistor 100 may act as a neuron of a neural network and can hold a weight value that acts as an input to a level of a neural network. In some embodiments, such as embodiments in which the ferroelectric material of the gate dielectric 116 has multiple domains and can have multiple levels, the transistor 100 can hold one of several possible weight values, not just 0 or 1.

Figure 5:
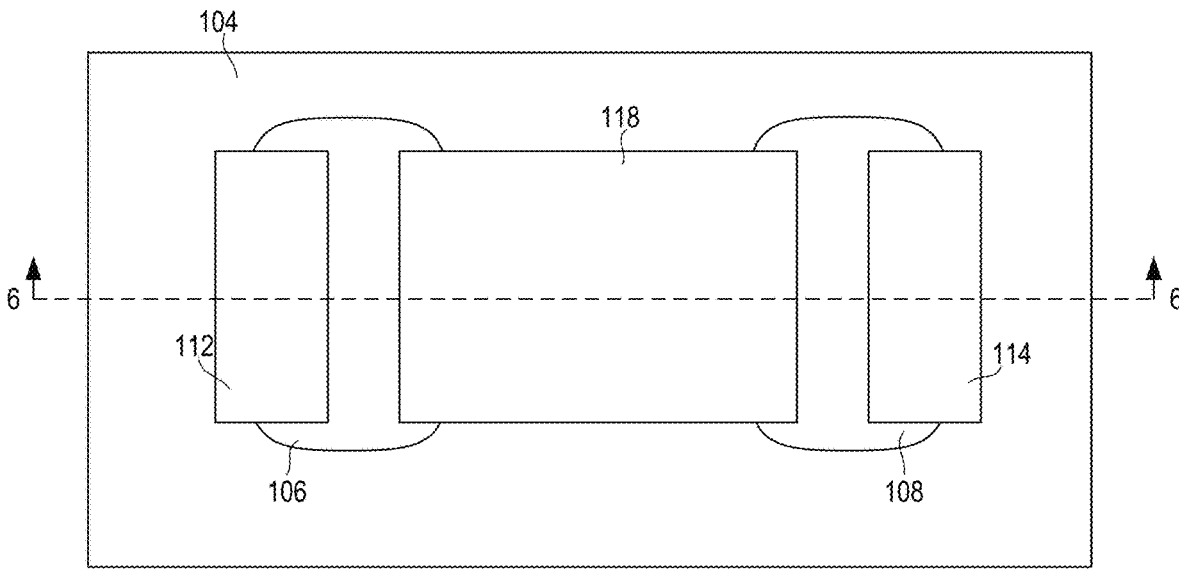
FIG. 5 is a top view of a transistor with a gate dielectric that is ferroelectric.
Figure 6:
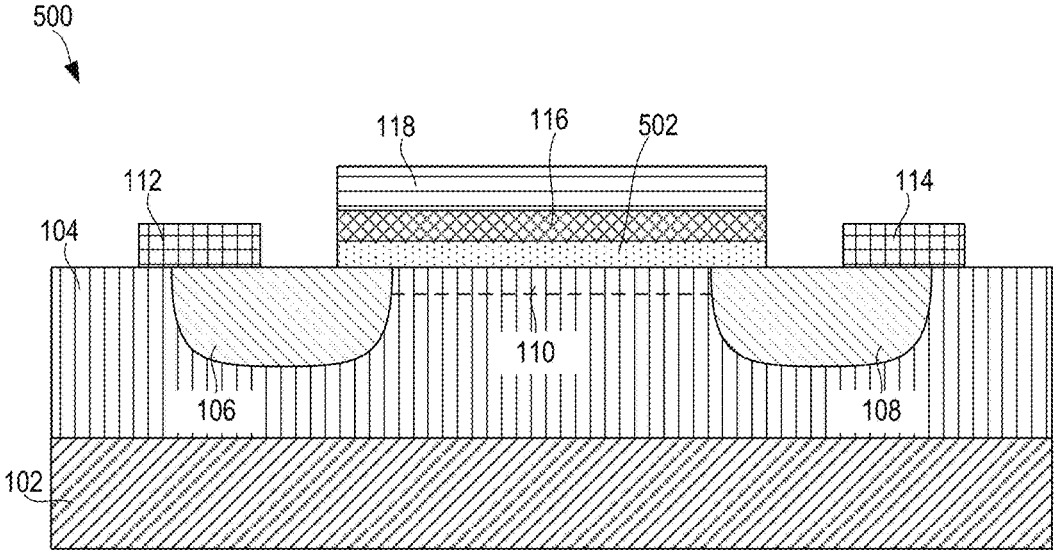
FIG. 6 is a cross-sectional side view of the transistor of FIG. 5.

Referring now to FIGS. 5 and 6, in one embodiment, a transistor 500 includes a linear gate dielectric 502 between the ferroelectric gate dielectric 116 and the channel 110. The transistor 500 includes similar components to the transistor 100, such as the body 104, the source 106, the drain 108, etc., a description of which will not be repeated in the interest of clarity. The linear gate dielectric 502 can reduce leakage current from the gate electrode 118, such as by reducing charge traps and/or oxygen vacancies. The linear gate dielectric 502 may be any suitable material. In some embodiments, the linear gate dielectric 502 may be selected to be similar to the channel 110 and/or the gate dielectric 116. For example, if the gate dielectric 116 is barium titanate, the linear gate dielectric 502 may be barium oxide, $BaZrO_3$, $SrZrO_3$, $LaScO_3$, $LaInO_3$, $SrSnO_3$, or titanium oxide. It should be appreciated that the linear gate dielectric 502 may have a relatively high dielectric constant, leading to a high electric displacement applied to the channel 110.

Figure 7:
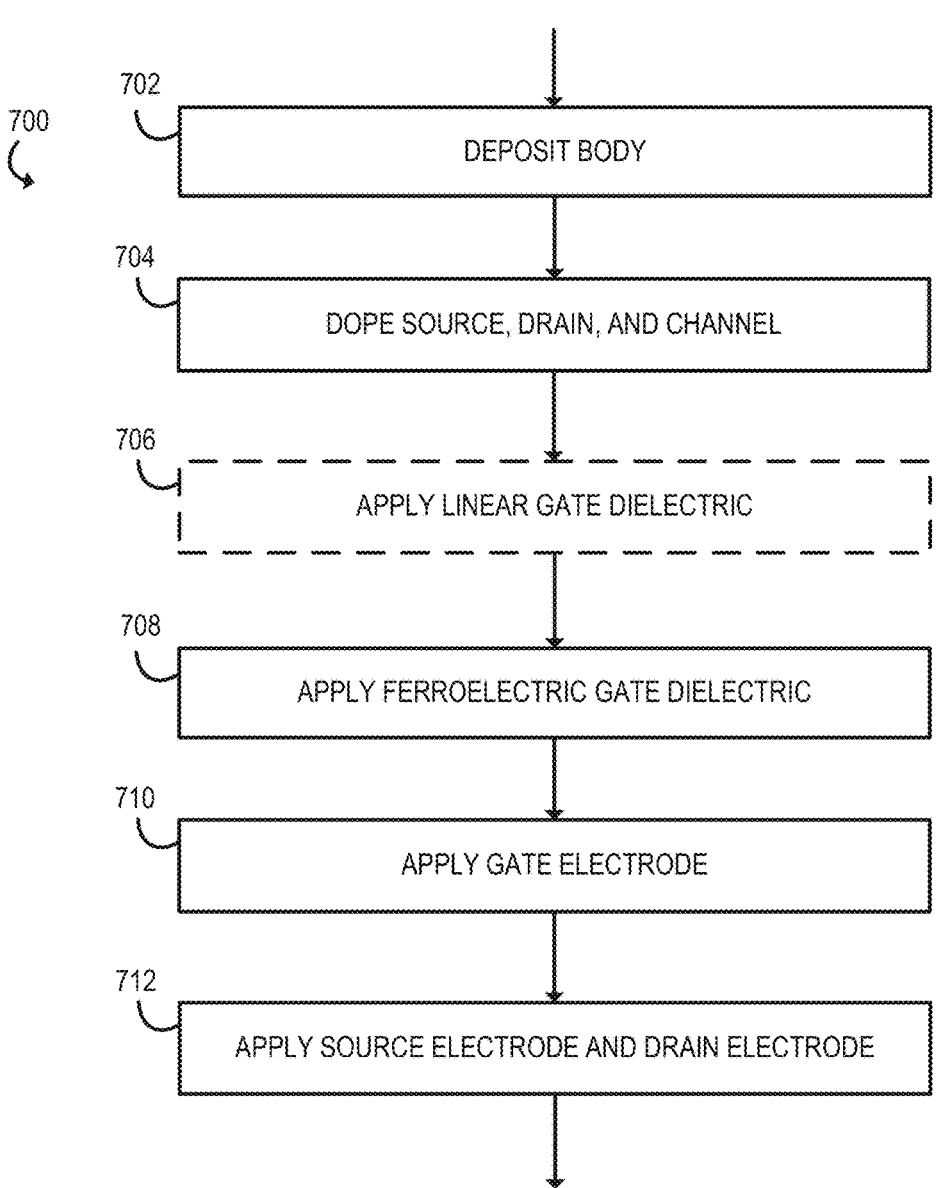
FIG. 7 is a simplified flow diagram of at least one embodiment of a method for creating a transistor with a gate dielectric that is ferroelectric.

Referring now to FIG. 7, in one embodiment, a flowchart for a method 700 for creating a transistor (such as transistor 100 or 500) is shown. The method 700 may be executed by a technician and/or by one or more automated machines. In some embodiments, one or more machines may be programmed to do some or all of the steps of the method 700. Such a machine may include, e.g., a memory, a processor, data storage, etc. The memory and/or data storage may store instructions that, when executed by the machine, causes the machine to perform some or all of the steps of the method 700. The method 700 may use any suitable set of techniques that are used in semiconductor processing, such as chemical vapor deposition, atomic layer deposition, physical vapor deposition, molecular beam epitaxy, pulsed laser deposition, layer transfer, photolithography, ion implantation, dry etching, wet etching, thermal treatments, etc.

The method 700 begins in block 702, in which the body 104 is deposited. In the illustrative embodiment, the body 104 is barium tin oxide. The body 104 is deposited on the substrate 102. The body 104 may be deposited in any suitable manner, such as chemical vapor deposition, atomic layer deposition, physical vapor deposition, molecular beam epitaxy, pulsed laser deposition, etc. In some embodiments, the body 104 is deposited using layer transfer. In the illustrative embodiment, the body 104 is the same base structure as the source 106, drain 108, and channel 110. As such, the source 106, drain 108, and channel 110 do not need to be separately deposited, and a variation in the doping of this same layer can be achieved during the deposition process, if desired. In other embodiments, the source 106, drain 108, and/or channel 110 may be made from a different material as the body 104 and may be deposited separately.

In block 704, the source 106, drain 108, and channel 110 are doped, such as by using ion implantation. The source 106 and drain 108 are relatively heavily doped, and the channel 110 is relatively lightly doped. The channel 110 is doped with the same carrier type as the source 106 and drain 108. For example, the channel 110 may be n-doped and the source 106 and drain 108 may be n-doped, or all three may be p-doped.

In some embodiments, in block 706, a linear gate dielectric 502 is applied, such as barium oxide, $BaZrO_3$, $SrZrO_3$, $LaScO_3$, $LaInO_3$, $SrSnO_3$, or titanium oxide. The linear gate dielectric 502 may be applied using, e.g., photolithography and chemical layer deposition. In some embodiments, a linear gate dielectric 502 may not be used.

Depending upon the details of the atomic termination of the channel layer 110, when, in block 706, a dielectric with a polarization mismatch 502 is applied, such as $LaScO_3$ or $LaInO_3$, the carrier concentration of the channel layer 110 may be altered through a process commonly known as "electronic reconstruction." This means of doping can be used in conjunction with doped (e.g., La-doped $BaSnO_3$) or even completely undoped (e.g., stoichiometric $BaSnO_3$) channel layers. The dielectric with a polarization mismatch 502 may be applied using an appropriate thin film growth technique in combination with patterning, e.g., photolithography and physical vapor deposition. In some embodiments a dielectric with a polarization mismatch 502 may not be used.

In some embodiments, in block 706, a doped dielectric with a positive conduction band offset 502 is applied, such as La-doped $SrSnO_3$. The purpose of the doped dielectric layer with positive conduction band offset is to alter the carrier concentration of the channel layer 110 through a process commonly known as "modulation doping." This means of doping can be used in conjunction with doped (e.g., La-doped $BaSnO_3$) or even completely undoped (e.g., stoichiometric $BaSnO_3$) channel layers. The doped dielectric with positive conduction band offset 502 may be applied using an appropriate thin film growth technique in combination with patterning, e.g., photolithography and physical vapor deposition. In some embodiments a doped dielectric with positive conduction band offset 502 may not be used.

In block 708, a ferroelectric gate dielectric 116 is applied. In the illustrative embodiment, the gate dielectric 116 is BTO or PZT. The ferroelectric gate dielectric 116 may be applied using, e.g., photolithography and physical vapor deposition.

In block 710, the gate electrode 118 is applied. In the illustrative embodiment, the gate electrode 118 is a metallic perovskite, such as SRO or LMSO. As discussed in more detail above, the gate electrode 118 may be selected based on its work function, which shifts the voltage at which the spontaneous polarization of the ferroelectric gate dielectric 116 changes.

In block 712, source electrode 112 and drain electrode 114 are applied. The source electrode 112 and drain electrode 114 may be any suitable material, such as platinum, iridium, or other metal, polysilicon, a metallic perovskite, etc. The source electrode 112 and drain electrode 114 may be applied using, e.g., photolithography and physical vapor deposition.

It should be appreciated that the method 700 is one of many possible embodiments of manufacturing the transistor 100. Different approaches or orders of steps are envisioned as well. For example, the ferroelectric gate dielectric 116 and gate electrode 118 may be applied before doping the source 106 and drain 108, creating a self-aligned gate. It should be appreciated that a complete manufacturing process of an integrated circuit that includes the transistor 100 may include steps not shown in the method 700, such as cleaning, surface passivation, creating interconnects, packaging, etc.

Figure 8:
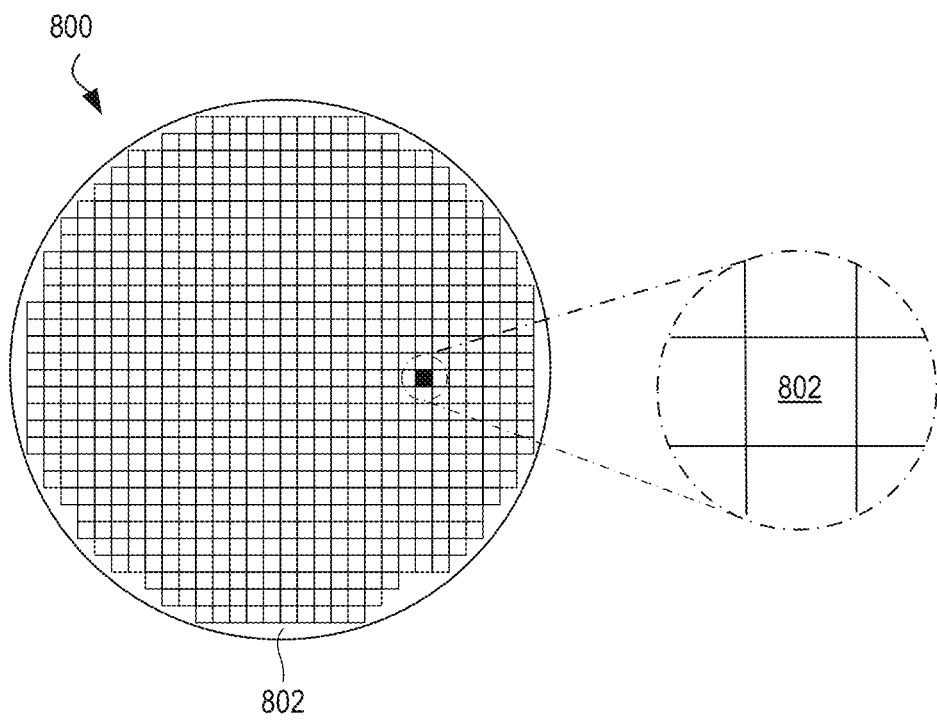
FIG. 8 is a top view of a wafer and dies that may be included in a microelectronic assembly, in accordance with any of the embodiments disclosed herein.

FIG. 8 is a top view of a wafer 800 and dies 802 that may include one or more of any of the transistors 100, 500 disclosed herein. The wafer 800 may be composed of semiconductor material and may include one or more dies 802 having integrated circuit structures formed on a surface of the wafer 800. The individual dies 802 may be a repeating unit of an integrated circuit product that includes any suitable integrated circuit. After the fabrication of the semiconductor product is complete, the wafer 800 may undergo a singulation process in which the dies 802 are separated from one another to provide discrete "chips" of the integrated circuit product. The die 802 may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 802. For example, a memory array formed by multiple memory devices may be formed on a same die 802 as a processor unit (e.g., the processor unit 1202 of FIG. 12) or other logic that is configured to store information in the memory devices or execute instructions stored in the memory array. Various ones of the transistors 100, 500 disclosed herein may be manufactured using a die-to-wafer assembly technique in which some dies are attached to a wafer 800 that include others of the dies, and the wafer 800 is subsequently singulated.

Figure 9:
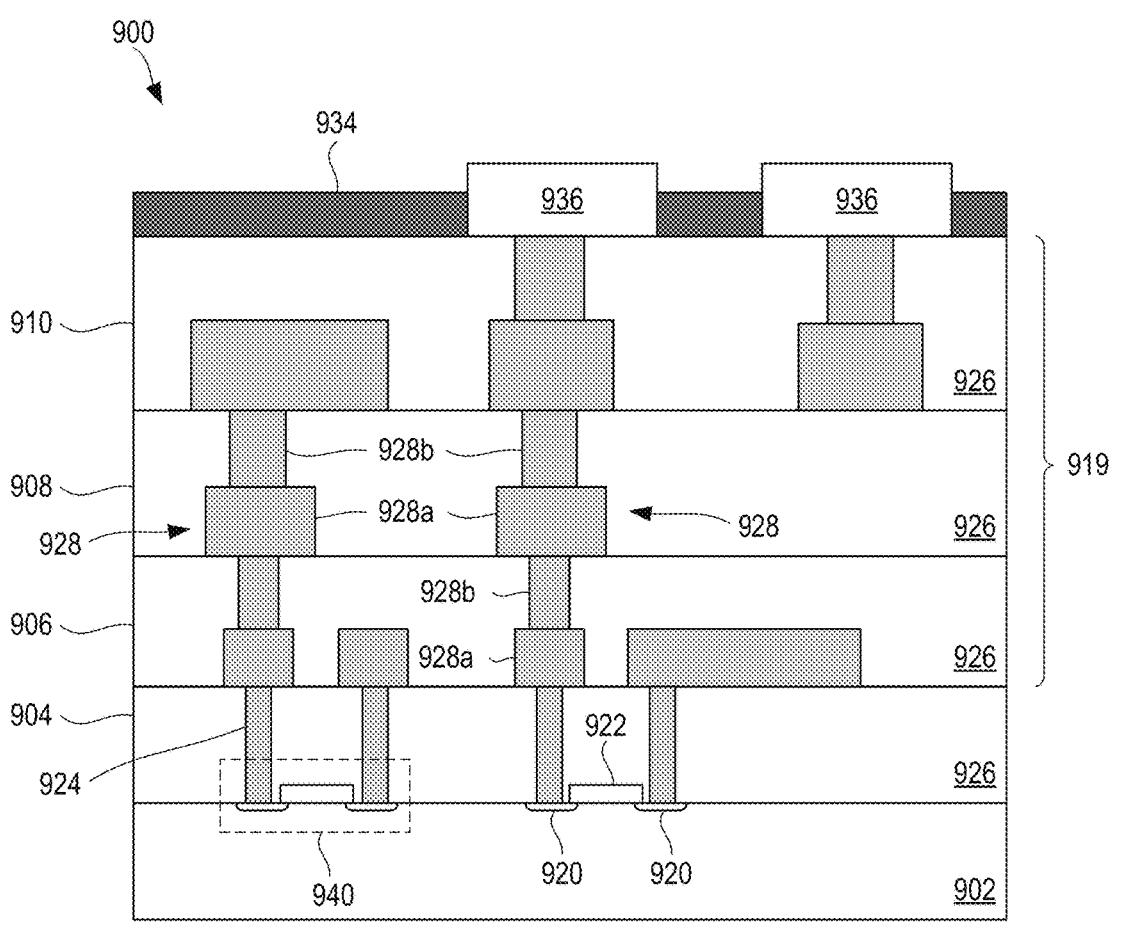
FIG. 9 is a cross-sectional side view of an integrated circuit device that may be included in a microelectronic assembly, in accordance with any of the embodiments disclosed herein.

FIG. 9 is a cross-sectional side view of an integrated circuit device 900 that may include any of the transistors 100, 500 disclosed herein. One or more of the integrated circuit devices 900 may be included in one or more dies 802 (FIG. 8). The integrated circuit device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an integrated circuit device 900 may be used. The die substrate 902 may be part of a singulated die (e.g., the dies 802 of FIG. 8) or a wafer (e.g., the wafer 800 of FIG. 8).

The integrated circuit device 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920. The transistors 940 may include additional features not depicted for the sake of clarity, such as device isolation regions, gate contacts, and the like. The transistors 940 are not limited to the type and configuration depicted in FIG. 9 and may include a wide variety of other types and configurations such as, for example, planar transistors, non-planar transistors, or a combination of both. Non-planar transistors may include FinFET transistors, such as doublegate transistors or tri-gate transistors, and wrap-around or all-around gate transistors, such as nanoribbon, nanosheet, or nanowire transistors.

FIGS. 10A-10D are simplified perspective views of example planar, FinFET, gate-all-around, and stacked gate-all-around transistors. Any of the transistors 100, 500 may be implemented as FinFET, gate-all-around, and stacked gate-all-around transistors. The transistors illustrated in FIGS. 10A-10D are formed on a substrate 1016 having a surface 1008. Isolation regions 1014 separate the source and drain regions of the transistors from other transistors and from a bulk region 1018 of the substrate 1016.

Figures 10A, 10B, 10C, 10D:
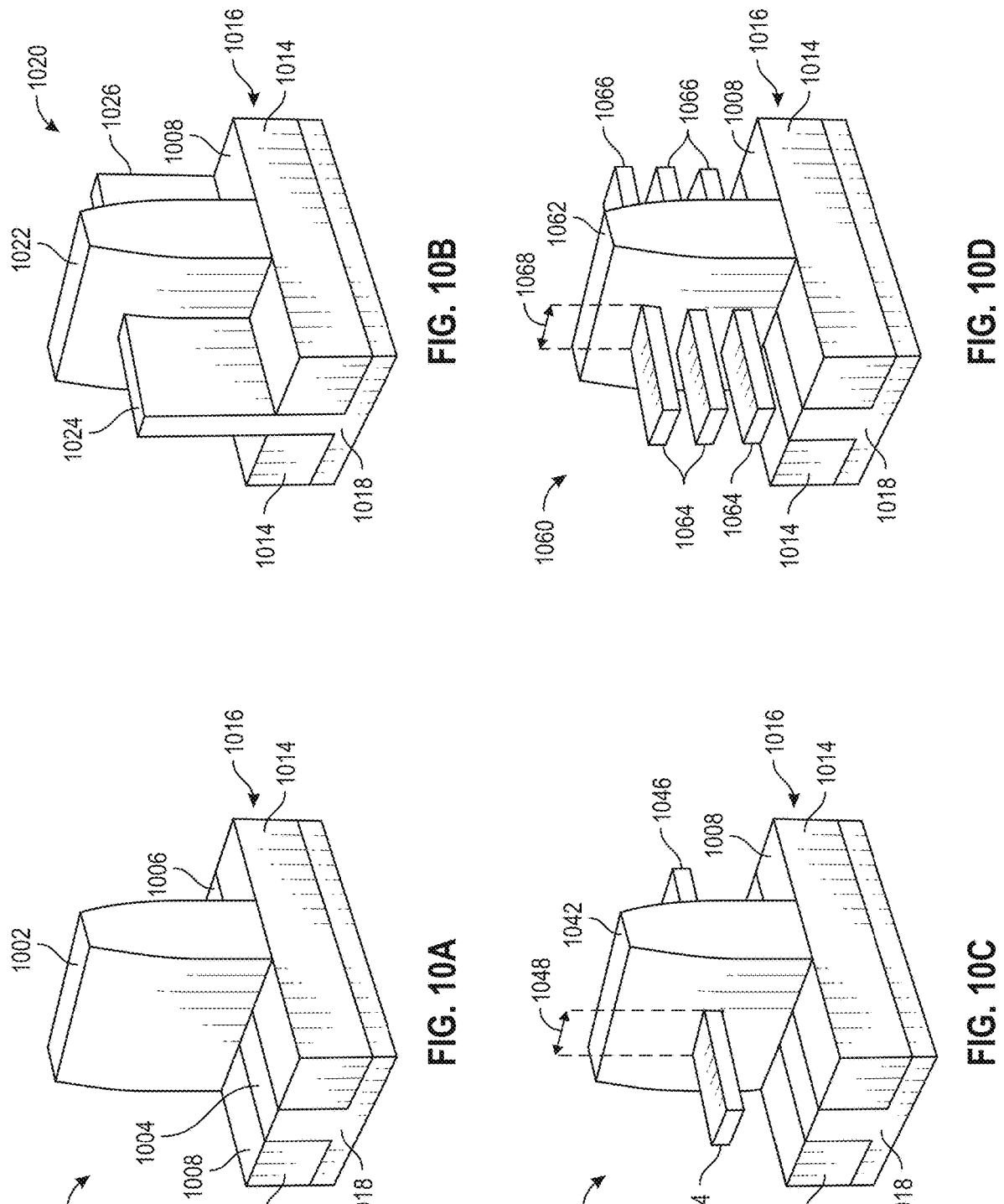
FIGS. 10A-10D are perspective views of example planar, FinFET, gate-all-around, and stacked gate-all-around transistors.

FIG. 10A is a perspective view of an example planar transistor 1000 comprising a gate 1002 that controls current flow between a source region 1004 and a drain region 1006. The transistor 1000 is planar in that the source region 1004 and the drain region 1006 are planar with respect to the substrate surface 1008.

FIG. 10B is a perspective view of an example FinFET transistor 1020 comprising a gate 1022 that controls current flow between a source region 1024 and a drain region 1026. The transistor 1020 is non-planar in that the source region 1024 and the drain region 1026 comprise "fins" that extend upwards from the substrate surface 1028. As the gate 1022 encompasses three sides of the semiconductor fin that extends from the source region 1024 to the drain region 1026, the transistor 1020 can be considered a tri-gate transistor. FIG. 10B illustrates one S/D fin extending through the gate 1022, but multiple S/D fins can extend through the gate of a FinFET transistor.

FIG. 10C is a perspective view of a gate-all-around (GAA) transistor 1040 comprising a gate 1042 that controls current flow between a source region 1044 and a drain region 1046. The transistor 1040 is non-planar in that the source region 1044 and the drain region 1046 are elevated from the substrate surface 1028.

FIG. 10D is a perspective view of a GAA transistor 1060 comprising a gate 1062 that controls current flow between multiple elevated source regions 1064 and multiple elevated drain regions 1066. The transistor 1060 is a stacked GAA transistor as the gate controls the flow of current between multiple elevated S/D regions stacked on top of each other. The transistors 1040 and 1060 are considered gate-all-around transistors as the gates encompass all sides of the semiconductor portions that extends from the source regions to the drain regions. The transistors 1040 and 1060 can alternatively be referred to as nanowire, nanosheet, or nanoribbon transistors depending on the width (e.g., widths 1048 and 1068 of transistors 1040 and 1060, respectively) of the semiconductor portions extending through the gate.

Returning to FIG. 9, a transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, bismuth, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920.

In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the integrated circuit device 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuit devices having more or fewer interconnect layers than depicted.

In some embodiments, the interconnect structures 928 may include lines 928a and/or vias 928b filled with an electrically conductive material such as a metal. The lines 928a may be arranged to route electrical signals in a direction of a plane that is substantially parallel with a surface of the die substrate 902 upon which the device layer 904 is formed. The vias 928b may be arranged to route electrical signals in a direction of a plane that is substantially perpendicular to the surface of the die substrate 902 upon which the device layer 904 is formed. In some embodiments, the vias 928b may electrically couple lines 928a of different interconnect layers 906-910 together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines 928a and/or vias 928b, as shown. The lines 928a of the first interconnect layer 906 may be coupled with contacts (e.g., the S/D contacts 924) of the device layer 904.

The vias 928*b* of the first interconnect layer 906 may be coupled with the lines 928*a* of a second interconnect layer 908.

The second interconnect layer 908 (referred to as Metal 2 or "M2") may be formed directly on the first interconnect layer 906. In some embodiments, the second interconnect layer 908 may include via 928*b* to couple the lines 928 of the second interconnect layer 908 with the lines 928*a* of a third interconnect layer 910. Although the lines 928*a* and the vias 928*b* are structurally delineated with a line within individual interconnect layers for the sake of clarity, the lines 928*a* and the vias 928*b* may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit device 900 (i.e., farther away from the device layer 904) may be thicker that the interconnect layers that are lower in the metallization stack 919, with lines 928*a* and vias 928*b* in the higher interconnect layers being thicker than those in the lower interconnect layers.

The integrated circuit device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit device 900 with another component (e.g., a printed circuit board). The integrated circuit device 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit device 900 is a double-sided die, the integrated circuit device 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit device 900 from the conductive contacts 936.

In other embodiments in which the integrated circuit device 900 is a double-sided die, the integrated circuit device 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit device 900 from the conductive contacts 936. In some embodiments, TSVs extending through the substrate can be used for routing power and ground signals from conductive contacts on the opposite side of the integrated circuit device 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuit devices 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 11:
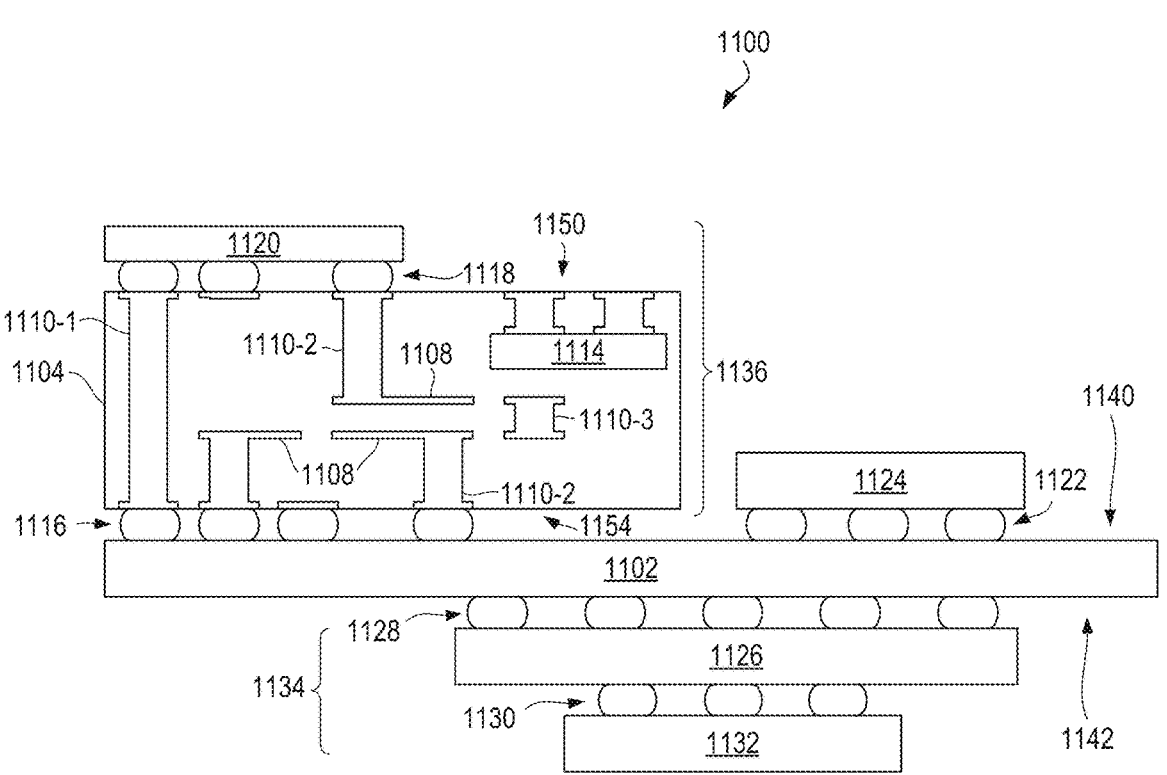
FIG. 11 is a cross-sectional side view of an integrated circuit device assembly that may include a microelectronic assembly, in accordance with any of the embodiments disclosed herein.

FIG. 11 is a cross-sectional side view of an integrated circuit device assembly 1100 that may include any of the transistors 100, 500 disclosed herein. The integrated circuit device assembly 1100 includes a number of components disposed on a circuit board 1102 (which may be a motherboard, system board, mainboard, etc.). The integrated circuit device assembly 1100 includes components disposed on a first face 1140 of the circuit board 1102 and an opposing second face 1142 of the circuit board 1102; generally, components may be disposed on one or both faces 1140 and 1142.

In some embodiments, the circuit board 1102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1102. In other embodiments, the circuit board 1102 may be a non-PCB substrate. The integrated circuit device assembly 1100 illustrated in FIG. 11 includes a package-on-interposer structure 1136 coupled to the first face 1140 of the circuit board 1102 by coupling components 1116. The coupling components 1116 may electrically and mechanically couple the package-on-interposer structure 1136 to the circuit board 1102, and may include solder balls (as shown in FIG. 11), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure.

The package-on-interposer structure 1136 may include an integrated circuit component 1120 coupled to an interposer 1104 by coupling components 1118. The coupling components 1118 may take any suitable form for the application, such as the forms discussed above with reference to the coupling components 1116. Although a single integrated circuit component 1120 is shown in FIG. 11, multiple integrated circuit components may be coupled to the interposer 1104; indeed, additional interposers may be coupled to the interposer 1104. The interposer 1104 may provide an intervening substrate used to bridge the circuit board 1102 and the integrated circuit component 1120.

The integrated circuit component 1120 may be a packaged or unpacked integrated circuit product that includes one or more integrated circuit dies (e.g., the die 802 of FIG. 8, the integrated circuit device 900 of FIG. 9) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1120, a single monolithic integrated circuit die comprises solder bumps attached to contacts on the die. The solder bumps allow the die to be directly attached to the interposer 1104. The integrated circuit component 1120 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1120 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1120 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1120 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1104 may spread connections to a wider pitch or reroute a connection to a different connection. For example, the interposer 1104 may couple the integrated circuit component 1120 to a set of ball grid array (BGA) conductive contacts of the coupling components 1116 for coupling to the circuit board 1102. In the embodiment illustrated in FIG. 11, the integrated circuit component 1120 and the circuit board 1102 are attached to opposing sides of the interposer 1104; in other embodiments, the integrated circuit component 1120 and the circuit board 1102 may be attached to a same side of the interposer 1104. In some embodiments, three or more components may be interconnected by way of the interposer 1104.

In some embodiments, the interposer 1104 may be formed as a PCB, including multiple metal layers separated from one another by layers of dielectric material and interconnected by electrically conductive vias. In some embodiments, the interposer 1104 may be formed of an epoxy resin, a fiberglass-reinforced epoxy resin, an epoxy resin with inorganic fillers, a ceramic material, or a polymer material such as polyimide. In some embodiments, the interposer 1104 may be formed of alternate rigid or flexible materials that may include the same materials described above for use in a semiconductor substrate, such as silicon, germanium, and other group III-V and group IV materials. The interposer 1104 may include metal interconnects 1108 and vias 1110, including but not limited to through hole vias 1110-1 (that extend from a first face 1150 of the interposer 1104 to a second face 1154 of the interposer 1104), blind vias 1110-2 (that extend from the first or second faces 1150 or 1154 of the interposer 1104 to an internal metal layer), and buried vias 1110-3 (that connect internal metal layers).

In some embodiments, the interposer 1104 can comprise a silicon interposer. Through silicon vias (TSV) extending through the silicon interposer can connect connections on a first face of a silicon interposer to an opposing second face of the silicon interposer. In some embodiments, an interposer 1104 comprising a silicon interposer can further comprise one or more routing layers to route connections on a first face of the interposer 1104 to an opposing second face of the interposer 1104.

The interposer 1104 may further include embedded devices 1114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1104. The package-on-interposer structure 1136 may take the form of any of the package-on-interposer structures known in the art. In embodiments where the interposer is a non-printed circuit board The integrated circuit device assembly 1100 may include an integrated circuit component 1124 coupled to the first face 1140 of the circuit board 1102 by coupling components 1122. The coupling components 1122 may take the form of any of the embodiments discussed above with reference to the coupling components 1116, and the integrated circuit component 1124 may take the form of any of the embodiments discussed above with reference to the integrated circuit component 1120.

The integrated circuit device assembly 1100 illustrated in FIG. 11 includes a package-on-package structure 1134 coupled to the second face 1142 of the circuit board 1102 by coupling components 1128. The package-on-package structure 1134 may include an integrated circuit component 1126 and an integrated circuit component 1132 coupled together by coupling components 1130 such that the integrated circuit component 1126 is disposed between the circuit board 1102 and the integrated circuit component 1132. The coupling components 1128 and 1130 may take the form of any of the embodiments of the coupling components 1116 discussed above, and the integrated circuit components 1126 and 1132 may take the form of any of the embodiments of the integrated circuit component 1120 discussed above. The package-on-package structure 1134 may be configured in accordance with any of the package-on-package structures known in the art.

FIG. 12 is a block diagram of an example electrical device 1200 that may include one or more of the transistors 100, 500 disclosed herein. For example, any suitable ones of the components of the electrical device 1200 may include one or more of the integrated circuit device assemblies 1100, integrated circuit components 1120, integrated circuit devices 900, or integrated circuit dies 802 disclosed herein. A number of components are illustrated in FIG. 12 as included in the electrical device 1200, but any one or more of these components may be omitted or duplicated, as suitable for the application. In some embodiments, some or all of the components included in the electrical device 1200 may be attached to one or more motherboards mainboards, or system boards. In some embodiments, one or more of these components are fabricated onto a single system-on-a-chip (SoC) die.

Additionally, in various embodiments, the electrical device 1200 may not include one or more of the components illustrated in FIG. 12, but the electrical device 1200 may include interface circuitry for coupling to the one or more components. For example, the electrical device 1200 may not include a display device 1206, but may include display device interface circuitry (e.g., a connector and driver circuitry) to which a display device 1206 may be coupled. In another set of examples, the electrical device 1200 may not include an audio input device 1224 or an audio output device 1208, but may include audio input or output device interface circuitry (e.g., connectors and supporting circuitry) to which an audio input device 1224 or audio output device 1208 may be coupled.

The electrical device 1200 may include one or more processor units 1202 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1202 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1200 may include a memory 1204, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 1204 may include memory that is located on the same integrated circuit die as the processor unit 1202. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1200 can comprise one or more processor units 1202 that are heterogeneous or asymmetric to another processor unit 1202 in the electrical device 1200. There can be a variety of differences between the processing units 1202 in a system in terms of a spectrum of metrics of merit including architectural, micro-architectural, thermal, power consumption characteristics, and the like. These differences can effectively manifest themselves as asymmetry and heterogeneity among the processor units 1202 in the electrical device 1200.

In some embodiments, the electrical device 1200 may include a communication component 1212 (e.g., one or more communication components). For example, the communication component 1212 can manage wireless communications for the transfer of data to and from the electrical device 1200. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1212 may operate in accordance with other wireless protocols in other embodiments. The electrical device 1200 may include an antenna 1222 to facilitate wireless communications and/or to receive other wireless communications (such as AM or FM radio transmissions).

In some embodiments, the communication component 1212 may manage wired communications, such as electrical, optical, or any other suitable communication protocols (e.g., IEEE 802.3 Ethernet standards). As noted above, the communication component 1212 may include multiple communication components. For instance, a first communication component 1212 may be dedicated to shorter-range wireless communications such as Wi-Fi or Bluetooth, and a second communication component 1212 may be dedicated to longer-range wireless communications such as global positioning system (GPS), EDGE, GPRS, CDMA, WiMAX, LTE, EV-DO, or others. In some embodiments, a first communication component 1212 may be dedicated to wireless communications, and a second communication component 1212 may be dedicated to wired communications.

The electrical device 1200 may include battery/power circuitry 1214. The battery/power circuitry 1214 may include one or more energy storage devices (e.g., batteries or capacitors) and/or circuitry for coupling components of the electrical device 1200 to an energy source separate from the electrical device 1200 (e.g., AC line power).

The electrical device 1200 may include a display device 1206 (or corresponding interface circuitry, as discussed above). The display device 1206 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1200 may include an audio output device 1208 (or corresponding interface circuitry, as discussed above). The audio output device 1208 may include any embedded or wired or wirelessly connected external device that generates an audible indicator, such speakers, headsets, or earbuds.

The electrical device 1200 may include an audio input device 1224 (or corresponding interface circuitry, as discussed above). The audio input device 1224 may include any embedded or wired or wirelessly connected device that generates a signal representative of a sound, such as microphones, microphone arrays, or digital instruments (e.g., instruments having a musical instrument digital interface (MIDI) output). The electrical device 1200 may include a Global Navigation Satellite System (GNSS) device 1218 (or corresponding interface circuitry, as discussed above), such as a Global Positioning System (GPS) device. The GNSS device 1218 may be in communication with a satellite-based system and may determine a geolocation of the electrical device 1200 based on information received from one or more GNSS satellites, as known in the art.

The electrical device 1200 may include an other output device 1210 (or corresponding interface circuitry, as discussed above). Examples of the other output device 1210 may include an audio codec, a video codec, a printer, a wired or wireless transmitter for providing information to other devices, or an additional storage device.

The electrical device 1200 may include an other input device 1220 (or corresponding interface circuitry, as discussed above). Examples of the other input device 1220 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1200 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1200 may be any other electronic device that processes data. In some embodiments, the electrical device 1200 may comprise multiple discrete physical components. Given the range of devices that the electrical device 1200 can be manifested as in various embodiments, in some embodiments, the electrical device 1200 can be referred to as a computing device or a computing system.

EXAMPLES

Illustrative examples of the technologies disclosed herein are provided below. An embodiment of the technologies may include any one or more, and any combination of, the examples described below.

Example 1 includes a device comprising a source; a drain; a channel between the source and the drain; a gate electrode; and a gate dielectric between the gate electrode and the channel, wherein the gate dielectric is ferroelectric, wherein the gate dielectric has a lattice constant that is matched to a lattice constant of the channel.

Example 2 includes the subject matter of Example 1, and wherein the gate dielectric is a first perovskite material, wherein the channel is a second perovskite material.

Example 3 includes the subject matter of any of Examples 1 and 2, and wherein the gate electrode is a metallic perovskite.

Example 4 includes the subject matter of any of Examples 1-3, and wherein the channel has an electron mobility of at least 50 $cm^2/(V*s)$.

Example 5 includes the subject matter of any of Examples 1-4, and wherein the device comprises a transistor, wherein the transistor comprises the source, the drain, the channel, the gate dielectric, and the gate electrode, wherein a threshold voltage of the transistor is less than 0.5 volts.

Example 6 includes the subject matter of any of Examples 1-5, and wherein the gate dielectric comprises lead, zirconium, titanium, and oxygen, wherein the channel comprises barium, tin, and oxygen.

Example 7 includes the subject matter of any of Examples 1-6, and wherein the gate electrode comprises strontium, ruthenium, and oxygen.

Example 8 includes the subject matter of any of Examples 1-7, and wherein the gate electrode comprises lanthanum, strontium, manganese, and oxygen.

Example 9 includes the subject matter of any of Examples 1-8, and further including a linear gate dielectric between the ferroelectric gate dielectric and the channel.

Example 10 includes the subject matter of any of Examples 1-9, and wherein the ferroelectric gate dielectric comprises barium, titanium, and oxygen, wherein the linear gate dielectric comprises (i) barium and oxygen or (ii) titanium and oxygen.

Example 11 includes the subject matter of any of Examples 1-10, and wherein the gate electrode has a work function such that the gate dielectric switches polarization in response to a change of voltage applied to the gate electrode from above a threshold voltage of the device to zero voltage.

Example 12 includes an integrated circuit comprising the device of Example 1, wherein a polarization state of the gate dielectric stores a weight of a neuron of a neural network.

Example 13 includes the subject matter of Example 12, and wherein the gate electrode has a work function such that the gate dielectric has two stable polarization states when zero voltage is applied to the gate electrode.

Example 14 includes a memory device comprising the device in Example 13, wherein the two stable polarization states of the gate dielectric is used to store a memory bit.

Example 15 includes the subject matter of Example 14, and wherein the device comprises a transistor, wherein the transistor comprises the source, the drain, the channel, the gate dielectric, and the gate electrode, wherein the transistor is a FinFET, a gate-all-around transistor, or a stacked gate-all-around-transistor.

Example 16 includes a processor comprising the device of Example 1.

Example 17 includes a system comprising the processor of Example 16 and one or more memory devices.

18. A device comprising a source; a drain; a channel between the source and the drain; a gate electrode; and a gate dielectric between the gate electrode and the channel, wherein the gate dielectric is ferroelectric, wherein the gate dielectric is a first perovskite material, wherein the channel is a second perovskite material.

Example 19 includes the subject matter of any of Examples 17 and 18, and wherein the gate dielectric has a lattice constant that is matched to a lattice constant of the channel.

Example 20 includes the subject matter of any of Examples 17-19, and wherein the gate electrode is a metallic perovskite.

Example 21 includes the subject matter of any of Examples 17-20, and wherein the channel has an electron mobility of at least 50 cm$^2$/(V*s).

Example 22 includes the subject matter of any of Examples 17-21, and wherein the device comprises a transistor, wherein the transistor comprises the source, the drain, the channel, the gate dielectric, and the gate electrode, wherein a threshold voltage of the transistor is less than 0.5 volts.

Example 23 includes the subject matter of any of Examples 17-22, and wherein the gate dielectric comprises lead, zirconium, titanium, and oxygen, wherein the channel comprises barium, tin, and oxygen.

Example 24 includes the subject matter of any of Examples 17-23, and wherein the gate electrode comprises strontium, ruthenium, and oxygen.

Example 25 includes the subject matter of any of Examples 17-24, and wherein the gate electrode comprises lanthanum, strontium, manganese, and oxygen.

Example 26 includes the subject matter of any of Examples 17-25, and further including a linear gate dielectric between the ferroelectric gate dielectric and the channel.

Example 27 includes the subject matter of any of Examples 17-26, and wherein the ferroelectric gate dielectric comprises barium, titanium, and oxygen, wherein the linear gate dielectric comprises (i) barium and oxygen or (ii) titanium and oxygen.

Example 28 includes the subject matter of any of Examples 17-27, and wherein the gate electrode has a work function such that the gate dielectric switches polarization in response to a change of voltage applied to the gate electrode from above a threshold voltage of the device to zero voltage.

Example 29 includes an integrated circuit comprising the device of Example 18, wherein a polarization state of the gate dielectric stores a weight of a neuron of a neural network.

Example 30 includes the subject matter of Example 29, and wherein the gate electrode has a work function such that the gate dielectric has two stable polarization states when zero voltage is applied to the gate electrode.

Example 31 includes a memory device comprising the device in Example 30, wherein the two stable polarization states of the gate dielectric is used to store a memory bit.

Example 32 includes the subject matter of Example 31, and wherein the device comprises a transistor, wherein the transistor comprises the source, the drain, the channel, the gate dielectric, and the gate electrode, wherein the transistor is a FinFET, a gate-all-around transistor, or a stacked gate-all-around-transistor.

Example 33 includes a processor comprising the device of Example 18.

Example 34 includes a system comprising the processor of Example 33 and one or more memory devices.

Example 35 includes a device comprising a transistor comprising a source; a drain; a channel between the source and the drain; a gate electrode; and a gate dielectric between the gate electrode and the channel, wherein the gate dielectric is ferroelectric, wherein a threshold voltage of the transistor is less than 0.5 volts.

Example 36 includes the subject matter of Example 35, and wherein the gate electrode is a metallic perovskite.

Example 37 includes the subject matter of any of Examples 35 and 36, and wherein the gate dielectric comprises lead, zirconium, titanium, and oxygen, wherein the channel comprises barium, tin, and oxygen.

Example 38 includes the subject matter of any of Examples 35-37, and wherein the gate electrode comprises strontium, ruthenium, and oxygen.

Example 39 includes the subject matter of any of Examples 35-38, and wherein the gate electrode comprises lanthanum, strontium, manganese, and oxygen.

Example 40 includes the subject matter of any of Examples 35-39, and further including a linear gate dielectric between the ferroelectric gate dielectric and the channel.

Example 41 includes the subject matter of any of Examples 35-40, and wherein the ferroelectric gate dielectric comprises barium, titanium, and oxygen, wherein the linear gate dielectric comprises (i) barium and oxygen or (ii) titanium and oxygen.

Example 42 includes the subject matter of any of Examples 35-41, and wherein the gate electrode has a work function such that the gate dielectric switches polarization in response to a change of voltage applied to the gate electrode from above the threshold voltage to zero voltage.

Example 43 includes an integrated circuit comprising the device of Example 35, wherein a polarization state of the gate dielectric stores a weight of a neuron of a neural network.

Example 44 includes the subject matter of Example 43, and wherein the gate electrode has a work function such that the gate dielectric has two stable polarization states when zero voltage is applied to the gate electrode.

Example 45 includes a memory device comprising the device in Example 44, wherein the two stable polarization states of the gate dielectric is used to store a memory bit.

Example 46 includes the subject matter of Example 45, and wherein the transistor is a FinFET, a gate-all-around transistor, or a stacked gate-all-around-transistor.

Example 47 includes a processor comprising the device of Example 35.

Example 48 includes a system comprising the processor of Example 47 and one or more memory devices.

Example 49 includes a method comprising depositing a channel of a transistor; depositing a gate dielectric over the channel, wherein the gate dielectric is ferroelectric; and depositing a gate electrode over the gate dielectric, wherein the gate dielectric has a lattice constant that is matched to a lattice constant of the channel.

Example 50 includes the subject matter of Example 49, and wherein the gate dielectric is a first perovskite material, wherein the channel is a second perovskite material.

Example 51 includes the subject matter of any of Examples 49 and 50, and wherein a threshold voltage of the transistor is less than 0.5 volts.

Example 52 includes the subject matter of any of Examples 49-51, and wherein the gate dielectric comprises lead, zirconium, titanium, and oxygen, wherein the channel comprises barium, tin, and oxygen.

Example 53 includes the subject matter of any of Examples 49-52, and wherein the gate electrode comprises strontium, ruthenium, and oxygen.

Example 54 includes the subject matter of any of Examples 49-53, and wherein the gate electrode comprises lanthanum, strontium, manganese, and oxygen.

The invention claimed is:

1. A device comprising:
a source;
a drain;
a channel between the source and the drain;
a gate electrode; and
a gate dielectric between the gate electrode and the channel, wherein the gate dielectric is ferroelectric,
wherein the gate dielectric has a lattice constant that is matched to a lattice constant of the channel,
wherein the gate dielectric is a first perovskite material,
wherein the channel is a second perovskite material,
wherein the gate electrode is a metallic perovskite.

2. The device of claim 1, wherein the channel has an electron mobility of at least 50 cm²/(V*s).

3. The device of claim 1, wherein the device comprises a transistor, wherein the transistor comprises the source, the drain, the channel, the gate dielectric, and the gate electrode, wherein a threshold voltage of the transistor is less than 0.5 volts.

4. The device of claim 1, wherein the gate dielectric comprises lead, zirconium, titanium, and oxygen, wherein the channel comprises barium, tin, and oxygen.

5. The device of claim 4, wherein the gate electrode comprises strontium, ruthenium, and oxygen.

6. The device of claim 1, further comprising a linear gate dielectric between the ferroelectric gate dielectric and the channel.

7. The device of claim 6, wherein the ferroelectric gate dielectric comprises barium, titanium, and oxygen, wherein the linear gate dielectric comprises (i) barium and oxygen or (ii) titanium and oxygen.

8. The device of claim 1, wherein the gate electrode has a work function such that the gate dielectric switches polarization in response to a change of voltage applied to the gate electrode from above a threshold voltage of the device to zero voltage.

9. An integrated circuit comprising the device of claim 1, wherein a polarization state of the gate dielectric stores a weight of a neuron of a neural network.

10. The device of claim 1, wherein the gate electrode has a work function such that the gate dielectric has two stable polarization states when zero voltage is applied to the gate electrode.

11. A memory device comprising the device in claim 10, wherein the two stable polarization states of the gate dielectric is used to store a memory bit.

12. The device of claim 1, wherein the device comprises a transistor, wherein the transistor comprises the source, the drain, the channel, the gate dielectric, and the gate electrode,
wherein the transistor is a FinFET, a gate-all-around transistor, or a stacked gate-all-around-transistor.

13. A processor comprising the device of claim 1.

14. A system comprising the processor of claim 13 and one or more memory devices.

15. A device comprising:
a source;
a drain;
a channel between the source and the drain;
a gate electrode; and
a gate dielectric between the gate electrode and the channel, wherein the gate dielectric is ferroelectric,
wherein the gate dielectric is a first perovskite material,
wherein the channel is a second perovskite material,
wherein the gate dielectric comprises lead, zirconium, titanium, and oxygen, wherein the channel comprises barium, tin, and oxygen,
wherein the gate electrode comprises strontium, ruthenium, and oxygen.

16. The device of claim 15, wherein the gate dielectric has a lattice constant that is matched to a lattice constant of the channel.

17. A device comprising:
a transistor comprising:
a source;
a drain;
a channel between the source and the drain;
a gate electrode; and
a gate dielectric between the gate electrode and the channel, wherein the gate dielectric is ferroelectric,
wherein a threshold voltage of the transistor is less than 0.5 volts,
wherein the gate electrode has a work function such that the gate dielectric switches polarization in response to a change of voltage applied to the gate electrode from above the threshold voltage to zero voltage.

18. The device of claim 17, wherein the gate dielectric comprises lead, zirconium, titanium, and oxygen, wherein the channel comprises barium, tin, and oxygen.

19. The device of claim 17, further comprising a linear gate dielectric between the ferroelectric gate dielectric and the channel.

20. The device of claim 19, wherein the ferroelectric gate dielectric comprises barium, titanium, and oxygen, wherein the linear gate dielectric comprises (i) barium and oxygen or (ii) titanium and oxygen.

* * * * *